United States Patent
Hu et al.

(10) Patent No.: US 8,105,875 B1
(45) Date of Patent: Jan. 31, 2012

(54) APPROACH FOR BONDING DIES ONTO INTERPOSERS

(75) Inventors: Hsien-Pin Hu, Zhubei (TW); Chen-Hua Yu, Hsin-Chu (TW); Shin-Puu Jeng, Hsin-Chu (TW); Shang-Yun Hou, Jubei (TW); Jing-Cheng Lin, Hsin-Chu (TW); Wen-Chih Chiou, Miaoli (TW); Hung-Jung Tu, Hualien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/904,835

(22) Filed: Oct. 14, 2010

(51) Int. Cl.
*H01L 21/50* (2006.01)

(52) U.S. Cl. ................... 438/107; 257/E21.499

(58) Field of Classification Search .......... 438/107
See application file for complete search history.

(56) References Cited

U.S. PATENT DOCUMENTS

| | | | |
|---|---|---|---|
| 2010/0044853 A1* | 2/2010 | Dekker et al. | 257/692 |
| 2010/0140805 A1* | 6/2010 | Chang et al. | 257/773 |
| 2010/0200992 A1* | 8/2010 | Purushothaman et al. | 257/758 |
| 2010/0216281 A1* | 8/2010 | Pagaila et al. | 438/107 |
| 2011/0062592 A1* | 3/2011 | Lee et al. | 257/774 |

OTHER PUBLICATIONS

"Polymer," Wikipedia, the free encyclopedia, online, downloaded Jun. 22, 2011, 16 pgs., http://en.wikipedia.org/wiki/Polymer.
"Thermoplastic," Wikipedia, the free encyclopedia, online, downloaded Jun. 22, 2011, 1 pg., http://en.wikipedia.org/wiki/Thermoplastic.

* cited by examiner

*Primary Examiner* — Thao P. Le
(74) *Attorney, Agent, or Firm* — Slater & Matsil, L.L.P.

(57) ABSTRACT

A method includes providing an interposer wafer including a substrate, and a plurality of through-substrate vias (TSVs) extending from a front surface of the substrate into the substrate. A plurality of dies is bonded onto a front surface of the interposer wafer. After the step of bonding the plurality of dies, a grinding is performed on a backside of the substrate to expose the plurality of TSVs. A plurality of metal bumps is formed on a backside of the interposer wafer and electrically coupled to the plurality of TSVs.

13 Claims, 14 Drawing Sheets

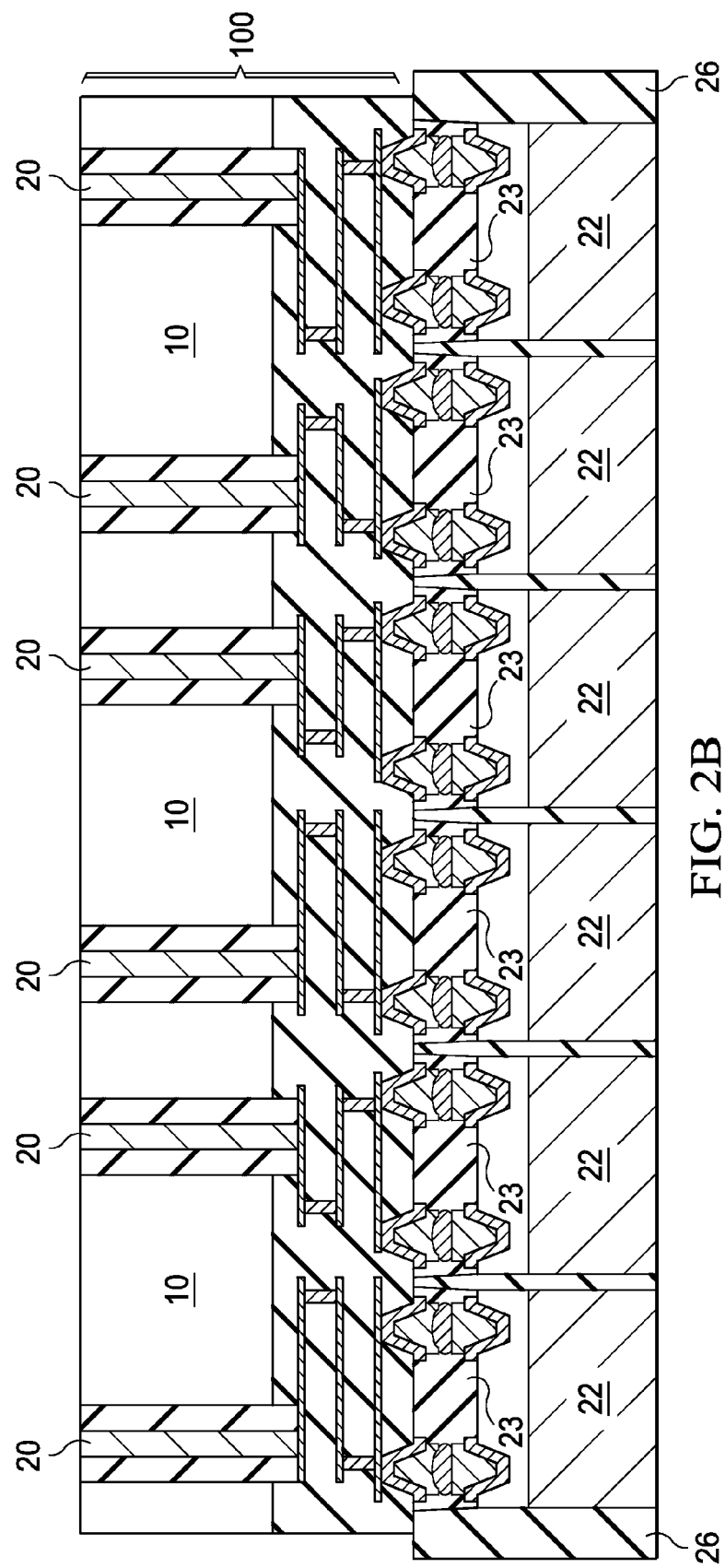

APPROACH FOR BONDING DIES ONTO INTERPOSERS

TECHNICAL FIELD

This disclosure relates generally to integrated circuits, and more particularly to three-dimensional integrated circuits (3DICs) comprising interposers and the method of forming the same.

BACKGROUND

Three-dimensional integrated circuits (3DICs) were commonly used, wherein two dies may be stacked, with through-silicon vias (TSVs) formed in one of the dies to connect the other die to a package substrate.

In conventional processes, an interposer wafer is provided first, with TSVs formed in the substrate of the interposer wafer. An interconnect structure is formed on one side of the interposer wafer. Next, a first carrier is mounted onto the interposer wafer. The Substrate is then thinned, until the TSVs are exposed. Solder bumps are then formed on the interposer wafer and electrically coupled to the TSVs.

Next, the first carrier is de-mounted from interposer wafer, and a second carrier is mounted onto interposer wafer. The first and the second carriers are mounted on opposite sides of the interposer wafer. Dies are then bonded onto interposer wafer, and the second carrier is de-mounted. In this process, two carriers are needed, which require two mounting steps and two de-mounting steps. The manufacturing cost is thus high.

SUMMARY

In accordance with one aspect, a method includes providing an interposer wafer including a substrate, and a plurality of through-substrate vias (TSVs) extending from a front surface of the substrate into the substrate. A plurality of dies is bonded onto a front surface of the interposer wafer. After the step of bonding the plurality of dies, a grinding is performed on a backside of the substrate to expose the plurality of TSVs. A plurality of metal bumps is formed on a backside of the interposer wafer and electrically coupled to the plurality of TSVs.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A through 2C are cross-sectional views of intermediate stages in the manufacturing of a 3DIC in accordance with various embodiments, wherein no carrier is used to support an interpose wafer.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel three-dimensional integrated circuit (3DIC) and the method of forming the same are provided. The intermediate stages of manufacturing an embodiment are illustrated. The variations of the embodiment are discussed. Throughout the various views and illustrative embodiments, like reference numbers are used to designate like elements.

Figure 1A:
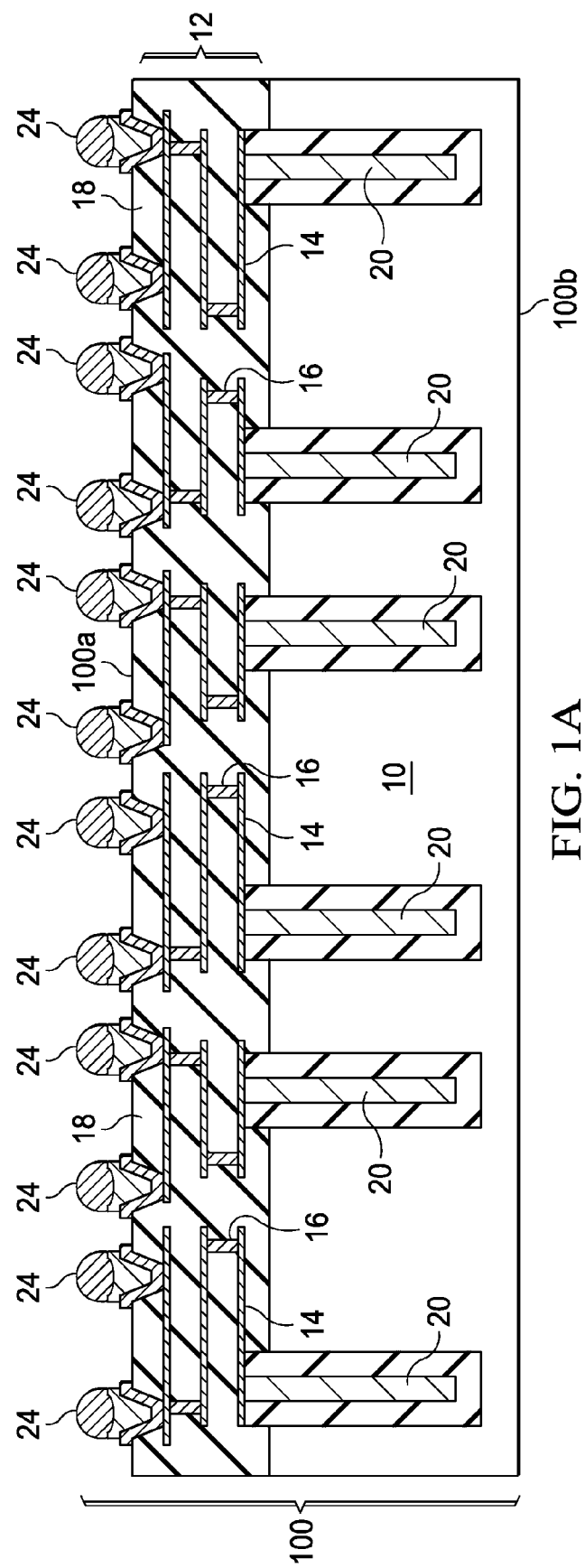
FIGS. 1A through 1H are cross-sectional views of intermediate stages in the manufacturing of a 3DIC in accordance with various embodiments, wherein one carrier is used to support an interpose wafer.

Referring to FIG. 1A, substrate 10 is provided. Throughout the description, substrate 10 and the corresponding interconnect structures 12 and 36 (not shown in FIG. 1A, please refer to FIG. 1G) in combination are referred to as interposer wafer 100. Substrate 10 may be formed of a semiconductor material such as silicon. Alternatively, substrate 10 is formed of a dielectric material. Interposer wafer 100 is substantially free from integrated circuit devices, including active devices such as transistors and diodes. Furthermore, interposer wafer 100 may include, or may be free from, passive devices, such as capacitors, resistors, inductors, varactors, and/or the like.

Front-side interconnect structure 12 is formed over substrate 10. Interconnect structure 12 includes one or more dielectric layer(s) 18, and metal lines 14 and vias 16 in dielectric layer(s) 18. Throughout the description, the side 100a of interposer wafer 100 facing up in FIG. 1A is referred to as a front side and the side 100b facing down is referred to as a backside. Metal lines 14 and vias 16 are referred to as front-side redistribution lines (RDLs). Further, through-substrate vias (TSVs) 20 are formed in substrate 10 to a predetermined depth, and may possibly extend into dielectric layer(s) 18. TSVs 20 are electrically coupled to front-side RDLs 14/16.

Next, front-side (metal) bumps (or bond pads) 24 are formed on the front-side of interposer wafer 100 and are electrically coupled to TSVs 20 and RDLs 14/16. In an embodiment, front-side metal bumps 24 are solder bumps, such as eutectic solder bumps. In alternative embodiments, front-side bumps 24 are copper bumps or other metal bumps formed of gold, silver, nickel, tungsten, aluminum, or alloys thereof.

Figure 1B:
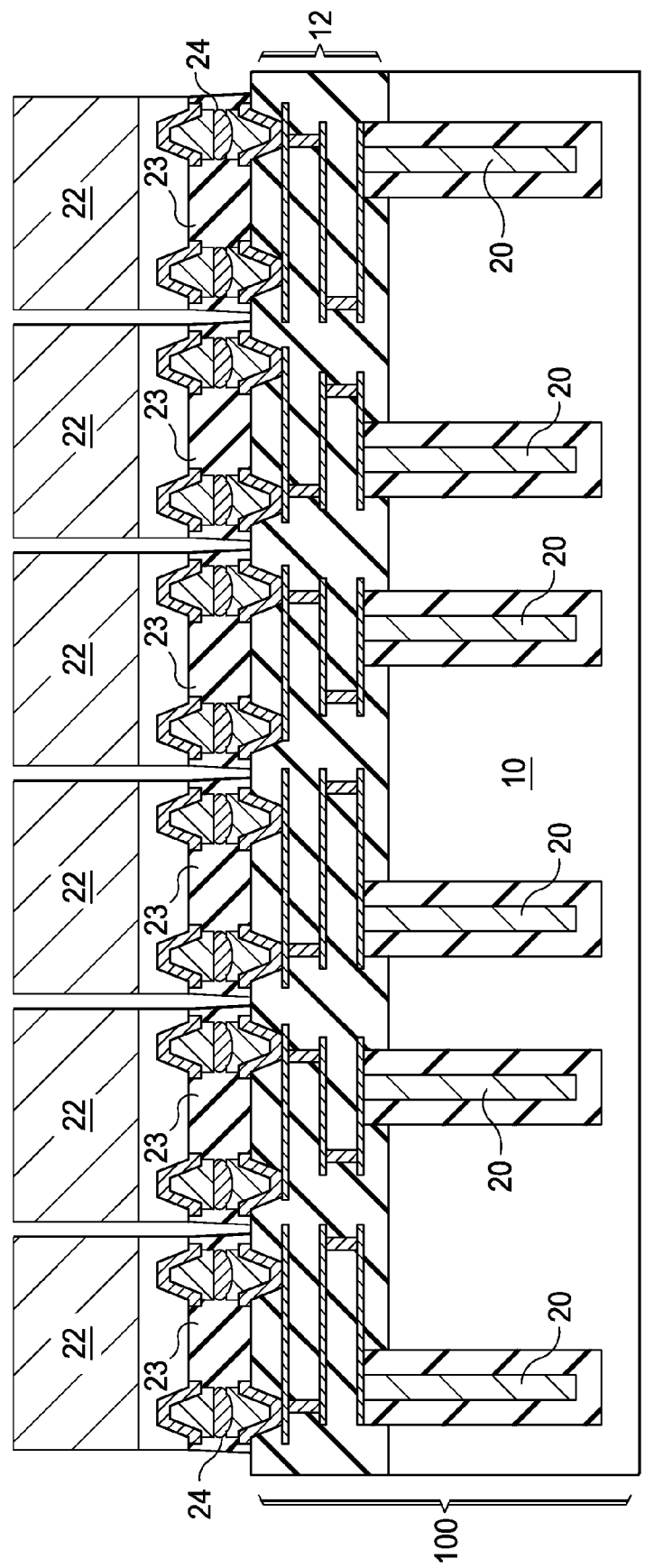

Referring to FIG. 1B, dies 22 are bonded to the front side of interposer wafer 100, and bonded to front-side bumps 24. Dies 22 may be device dies comprising integrated circuit devices, such as transistors, capacitors, inductors, resistors (not shown), and the like, therein. The bonding between dies 22 and bumps 24 may be a solder bonding or a direct metal-to-metal (such as a copper-to-copper) bonding. Underfill 23 is dispensed into the gaps between dies 22 and interposer wafer 100, and is cured.

Figure 1C:
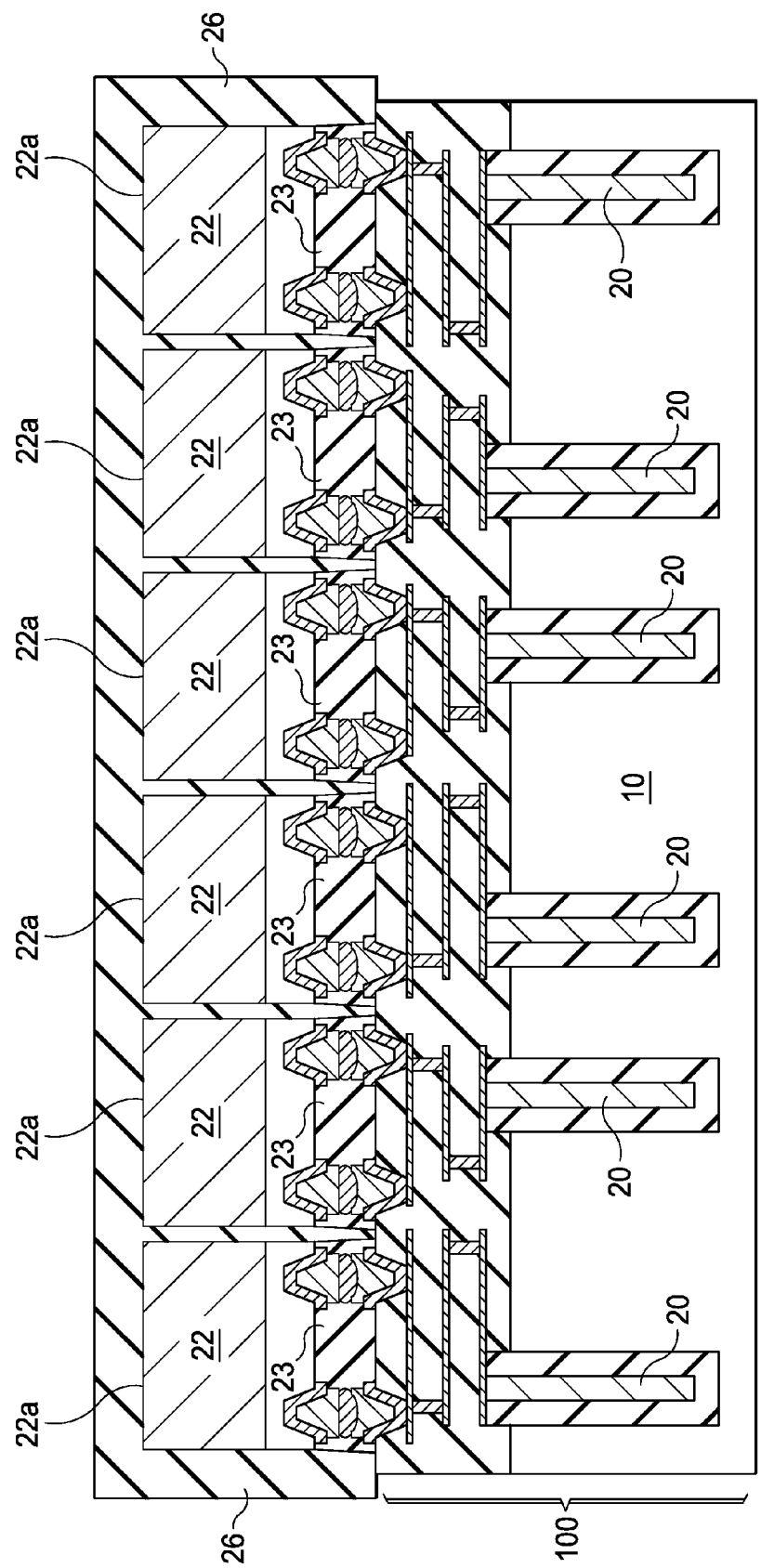
Figure 1D:
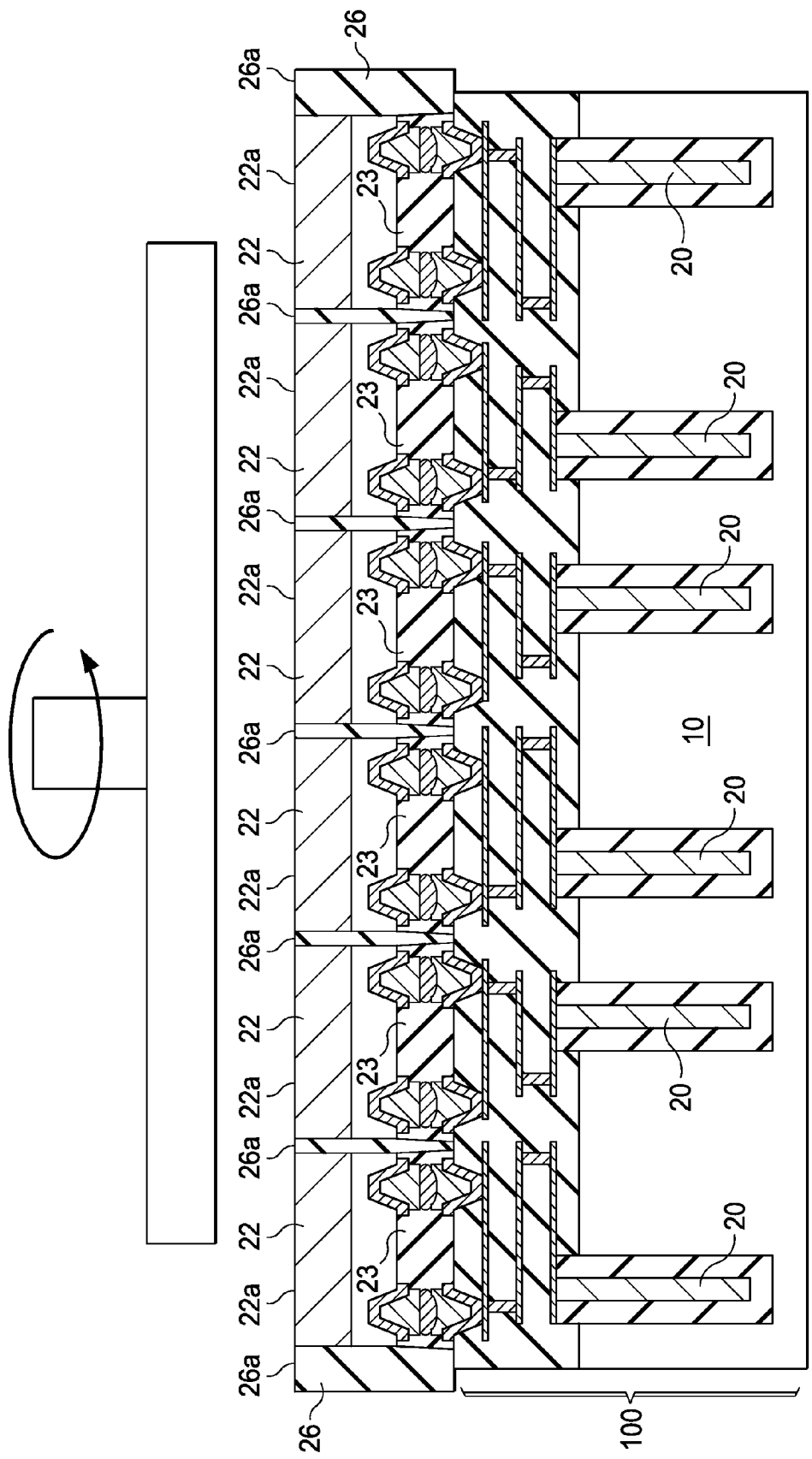

Referring to FIG. 1C, molding compound 26 is molded onto dies 22 and interposer wafer 100. The top surface of molding compound 26 may be higher than, level with, or slightly lower than, top surfaces 22a of dies 22. Molding compound 26 is further filled into the gaps between dies 22. Next, as shown in FIG. 1D, a grinding is performed to planarize top surfaces 22a of dies 22, so that any unevenness in the top surfaces 22a of dies 22 may be at least reduced, and possibly substantially eliminated. If molding compound 26 comprises portions on top surfaces 22a of dies 22, these portions of molding compound 26 are also removed by the grinding. Accordingly, top surfaces 26a of the remaining portions of molding compound 26 are level with top surfaces 22a of dies 22. Further, the thickness of dies 22 may also be reduced to a desirable value through the grinding.

Figure 1E:
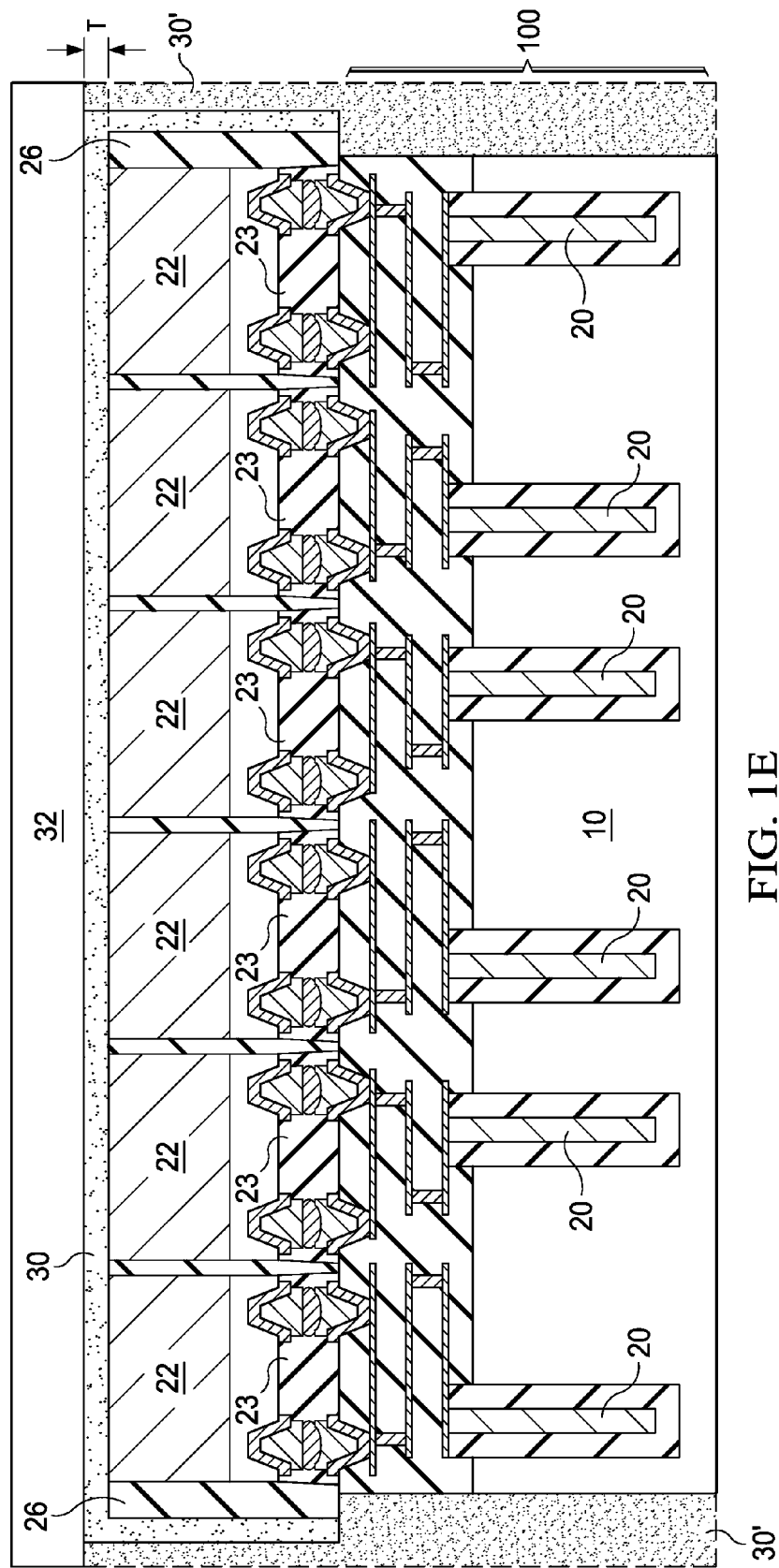

Referring to FIG. 1E, adhesive 30 is applied on the top surface of dies 22, followed by the mounting of carrier 32 through adhesive 30. Adhesive 30 may be an ultra-violet (UV) glue, or may be formed of other known adhesive materials. Carrier 32 may be a glass carrier. Thickness T of adhesive 30 may be small so that any interposer warpage due to the difference in coefficients of thermal expansion (CTE) of adhesive 30 and interposer wafer 100 may be minimized. Optionally, after the mounting of carrier 32, additional adhesive 30' is added to the edges of interposer wafer 100 to protect the edges of interposer wafer 100 from the damage that may occur in subsequent process steps, which damage may be caused by the chemicals using in subsequent etching steps.

Figure 1F:
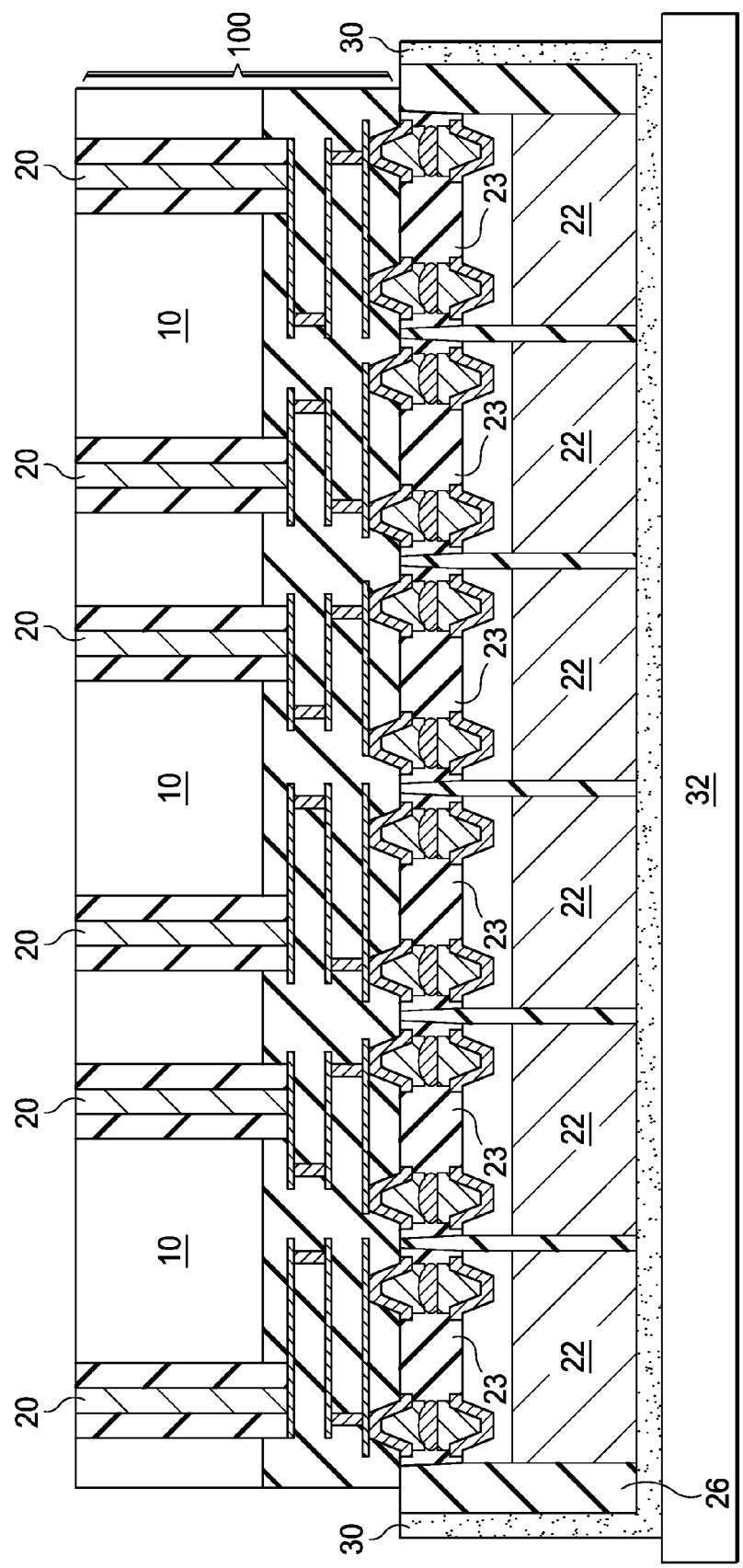
Figure 1G:
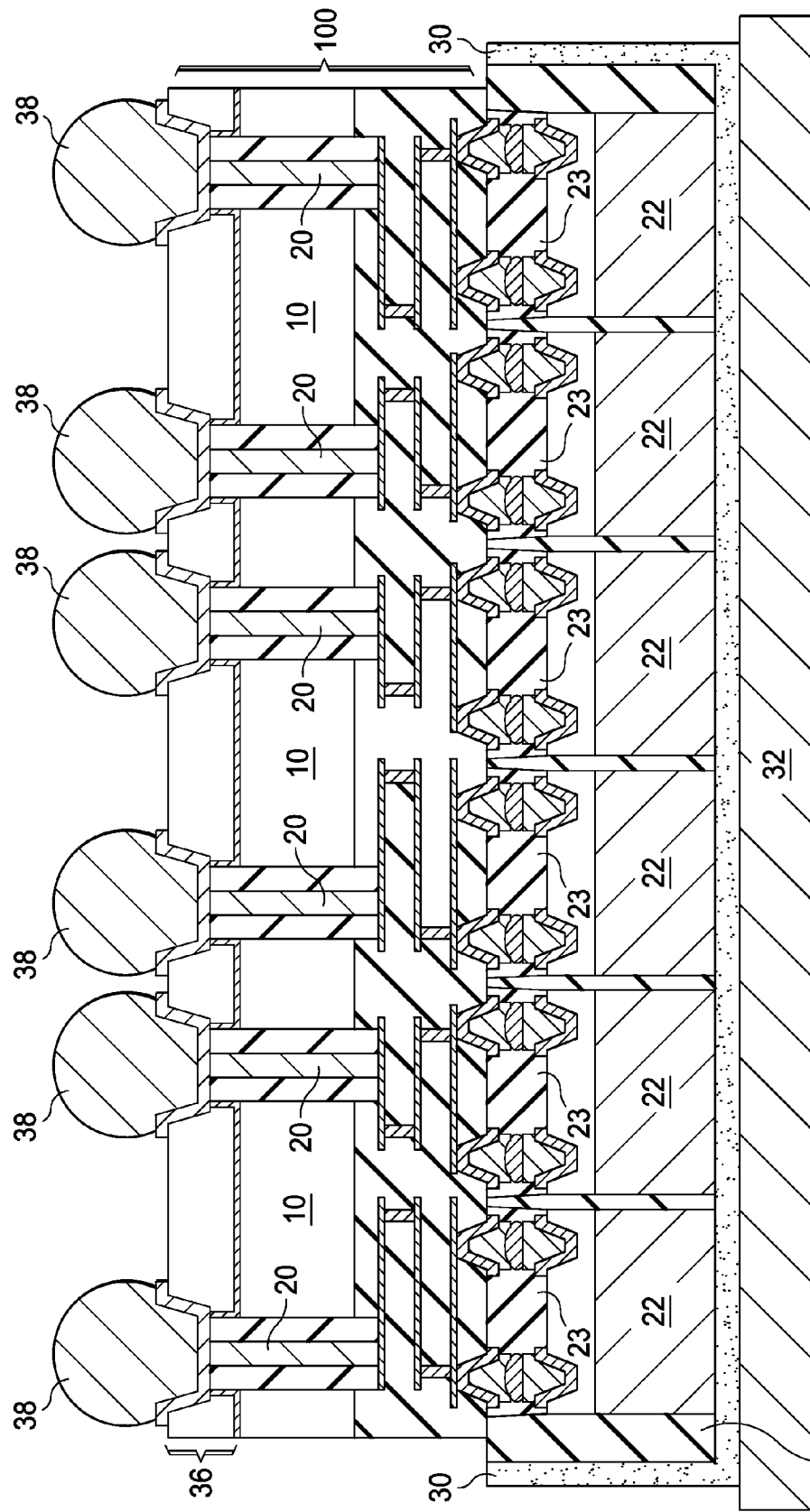

Referring to FIG. 1F, a wafer backside grinding is performed to thin substrate 10 from the backside, until TSVs 20 are exposed. An etch may be performed to further reduce the surface of substrate 10 so that TSVs 20 protrude out of the back surface of the remaining portion of substrate 10 (FIG. 1G). Next, as shown in FIG. 1G, backside interconnect structure 36 is formed to connect to TSVs 20. In various embodiments, backside interconnect structure 36 may have a similar structure as front-side interconnect structure 12, and may include one or more layer of redistribution lines (RDLs, not shown). Metal bumps 38 are then formed, and are electrically coupled to backside interconnect structure 36. Metal bumps 38 may be solder bumps such as eutectic solder bumps, copper bumps, or other metal bumps formed of gold, silver, nickel, tungsten, aluminum, and/or alloys thereof.

Figure 1H:
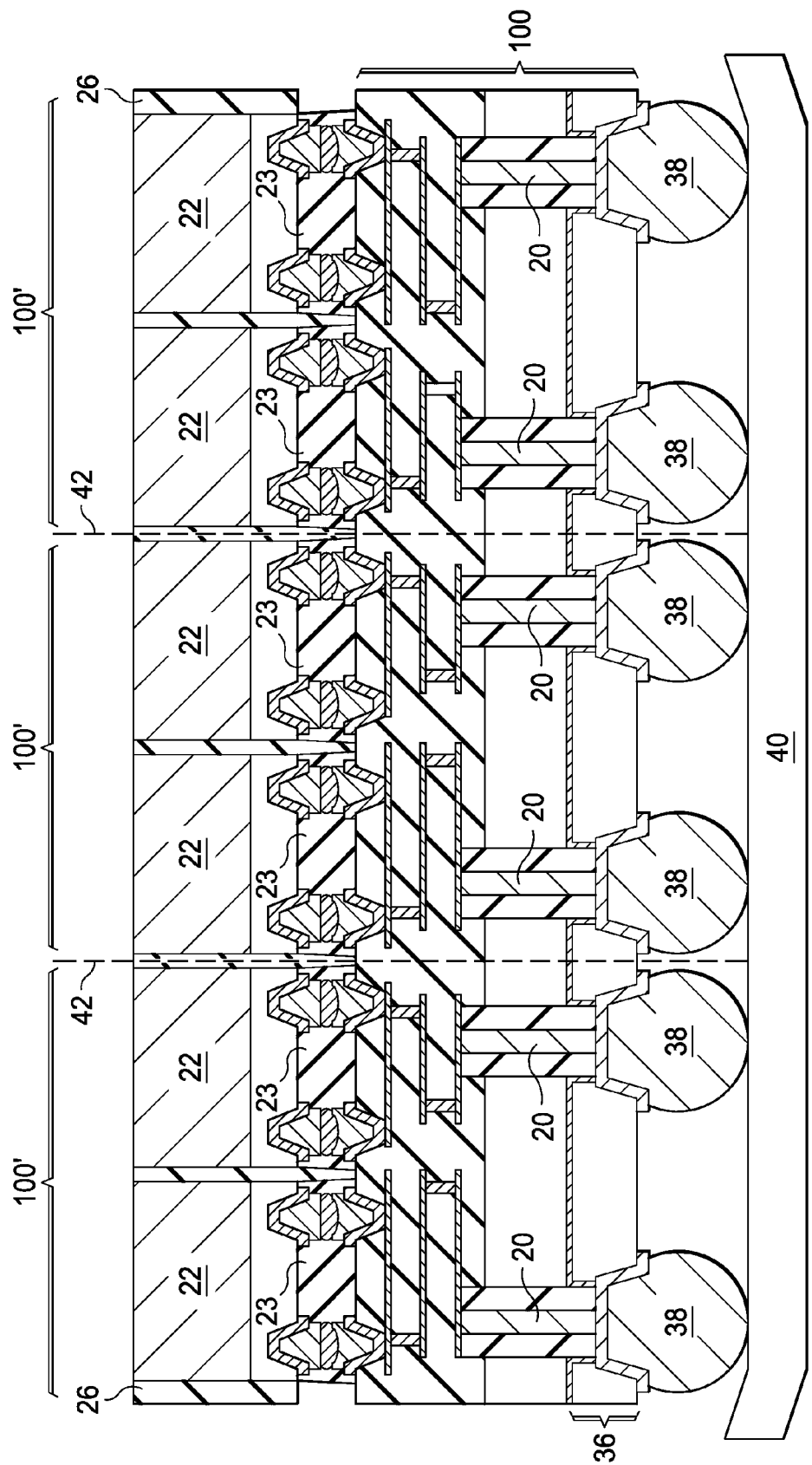

In FIG. 1H, carrier 32 as shown in FIG. 1G is de-bonded, for example, by exposing adhesive 30 to a UV light, causing it to lose its adhesive property. Adhesive 30 is also removed. Dicing tape 40 is then adhered to a side of the resulting structure, for example, to the side on which metal bumps 38 are located. Next, a dicing is performed along lines 42 to separate interposer wafer 100 and dies 22 into a plurality of dies. Each of the resulting dies includes one interposer die 100' and one or more top die 22. The resulting dies may then be bonded to other packaging components such as package substrates through metal bumps 38.

Figure 2A:
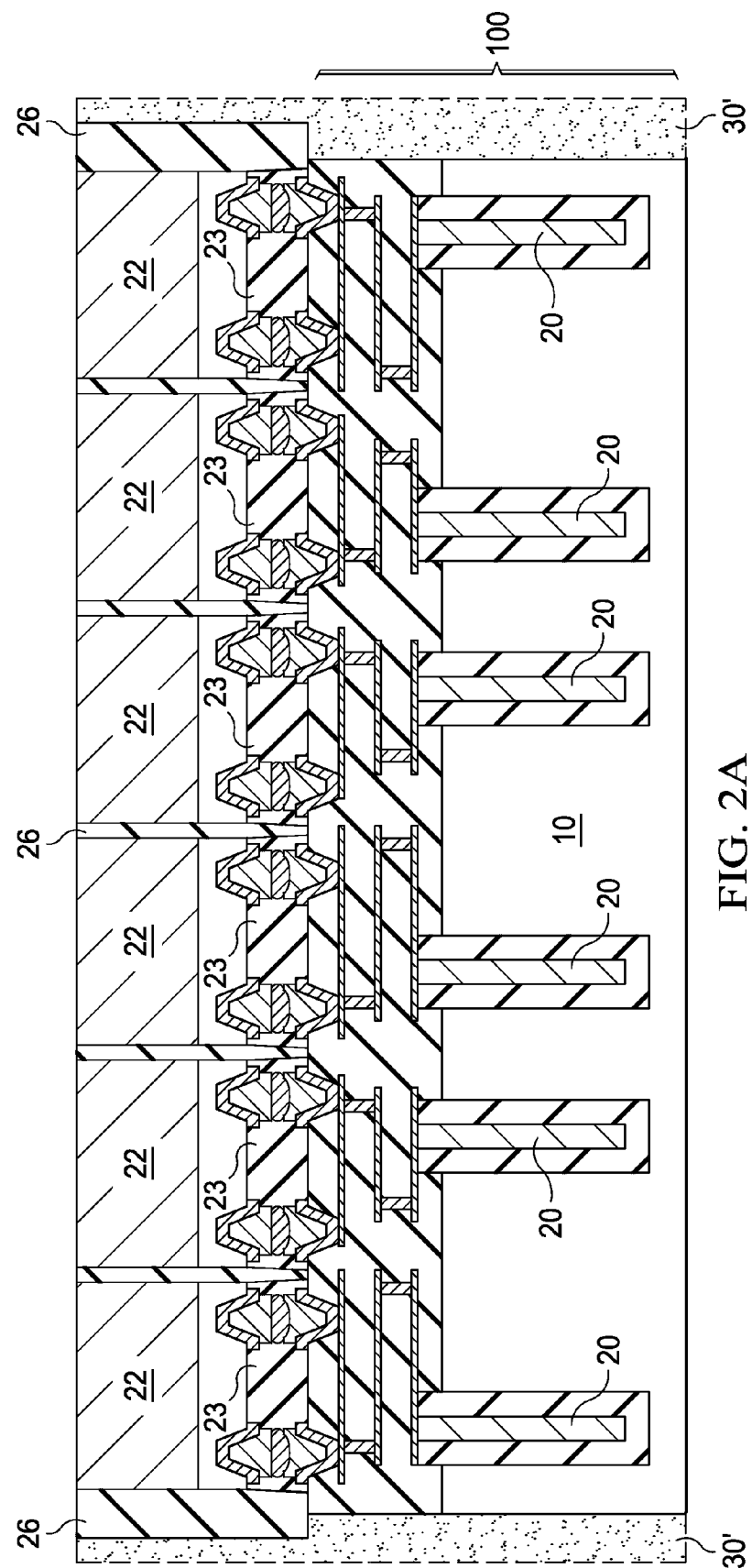

FIGS. 2A through 3C illustrate cross-sectional views of intermediate stages in the manufacturing of an alternative embodiment. Unless specified otherwise, the reference numerals in these embodiments represent like elements in the embodiments illustrated in FIGS. 1A through 1H. The initial steps of this embodiment are essentially the same as shown in FIGS. 1A through 1D. Next, as shown in FIG. 2A, optional adhesive 30' is added to the edges of interposer wafer 100 to ensure that the edges are protected from the damage that may occur to wafer 100 in subsequent process steps.

Figure 2C:
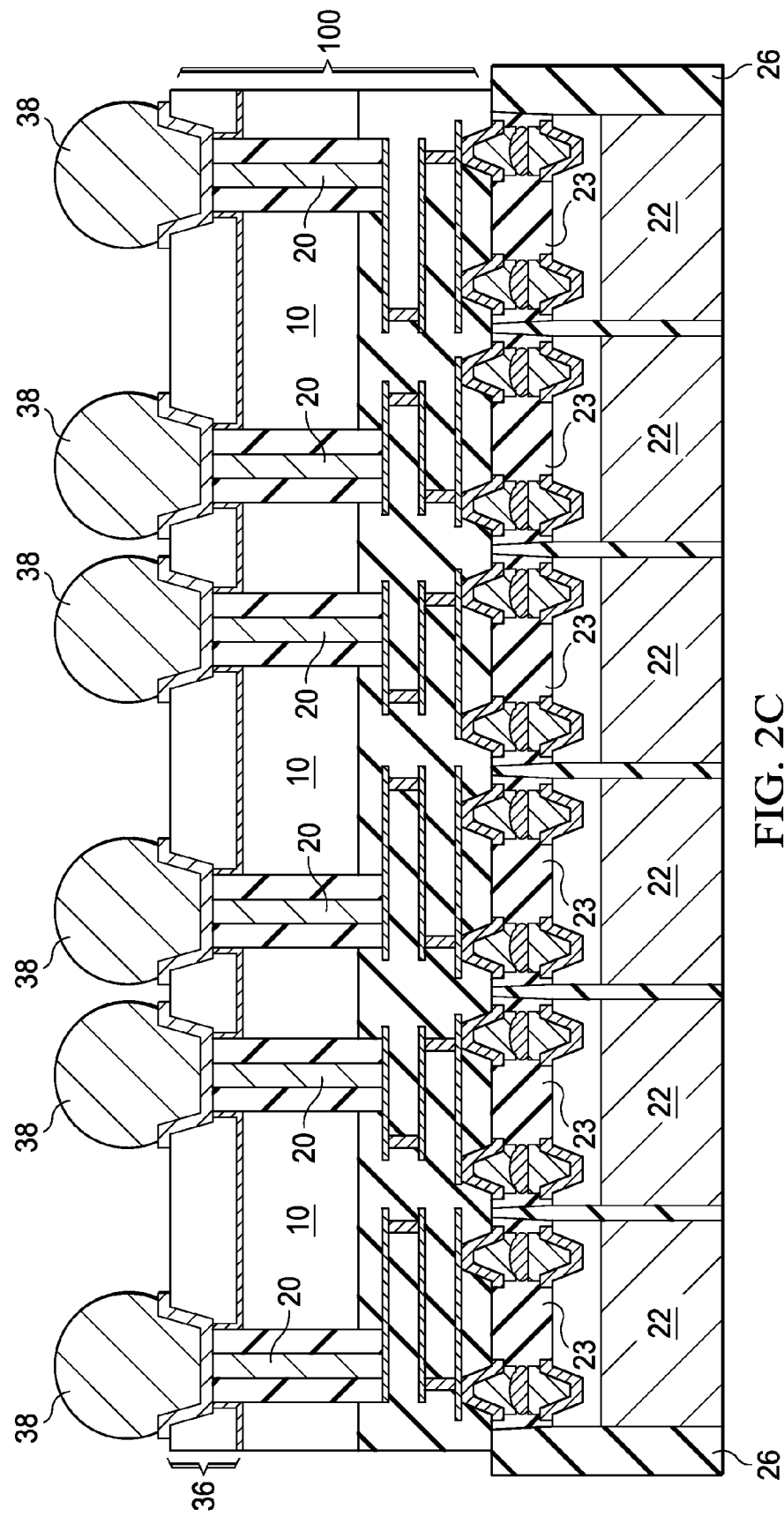

Referring to FIG. 2B, a wafer backside grinding is performed to thin substrate 10 from the backside, until TSVs 20 are exposed. An etch may be performed to further reduce the surface of substrate 10 so that TSVs 20 protrude out of the back surface of the remaining portion of substrate 10. During the backside grinding process, no carrier is mounted onto any one of interposer wafer 100 and dies 22. Instead, the structure as shown in FIG. 2B is self supporting and self strengthening, partially due to molding compound 26 that forms an integrated part with dies 22. Next, as shown in FIG. 2C, backside interconnect structure 36 is formed and are electrically coupled to TSVs 20. Metal bumps 38 are then formed to electrically couple to backside interconnect structure 36. During the formation of backside interconnect structure 36 and metal bumps 38, no carrier is mounted on any one of interposer wafer 100 and dies 22.

Figure 3A:
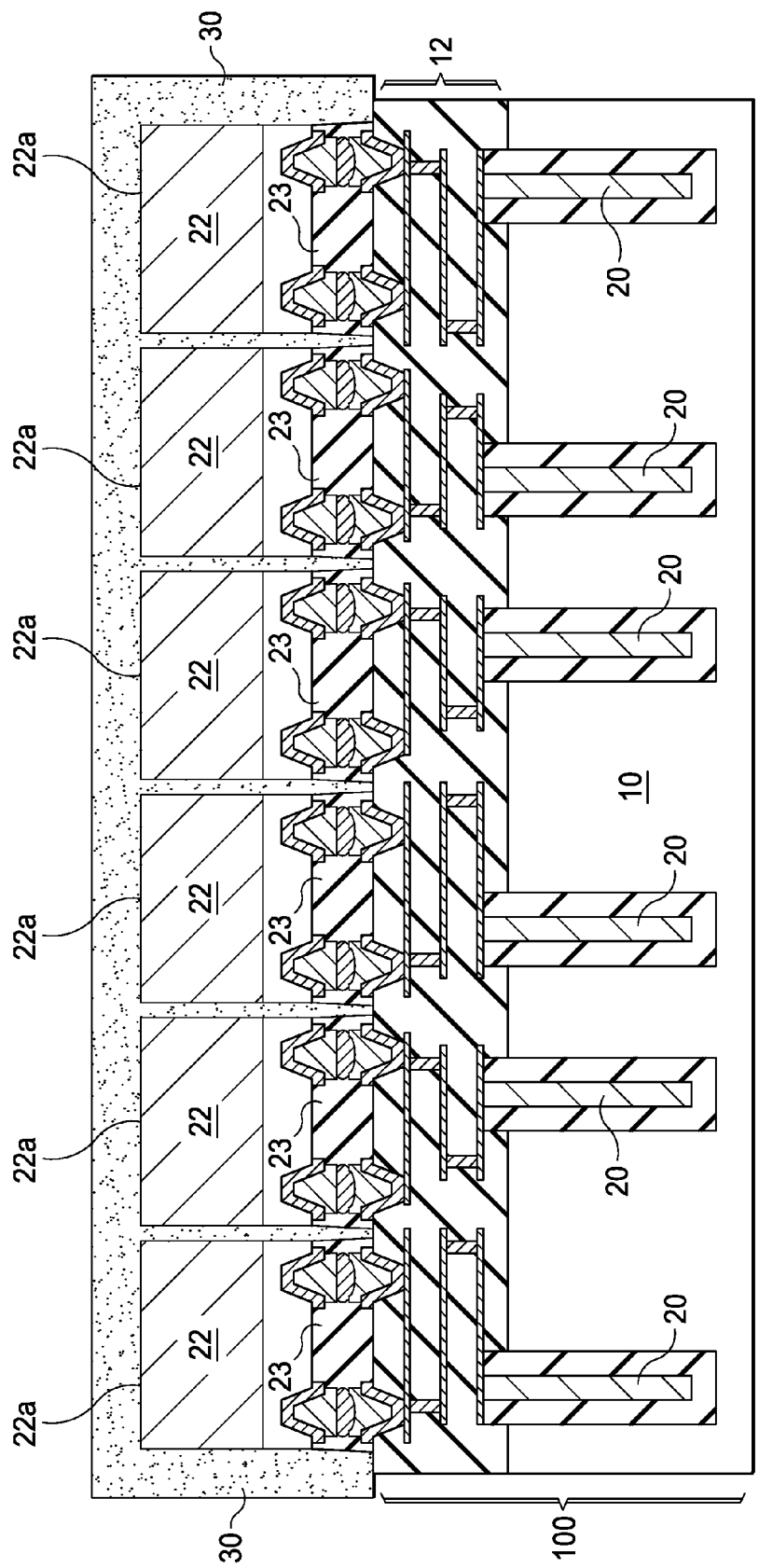
FIGS. 3A through 3C are cross-sectional views of intermediate stages in the manufacturing of a 3DIC in accordance with various embodiments, wherein one carrier is used to support an interpose wafer, and an adhesive is filled into gaps between the dies bonded onto the interposer wafer.
Figure 3B:
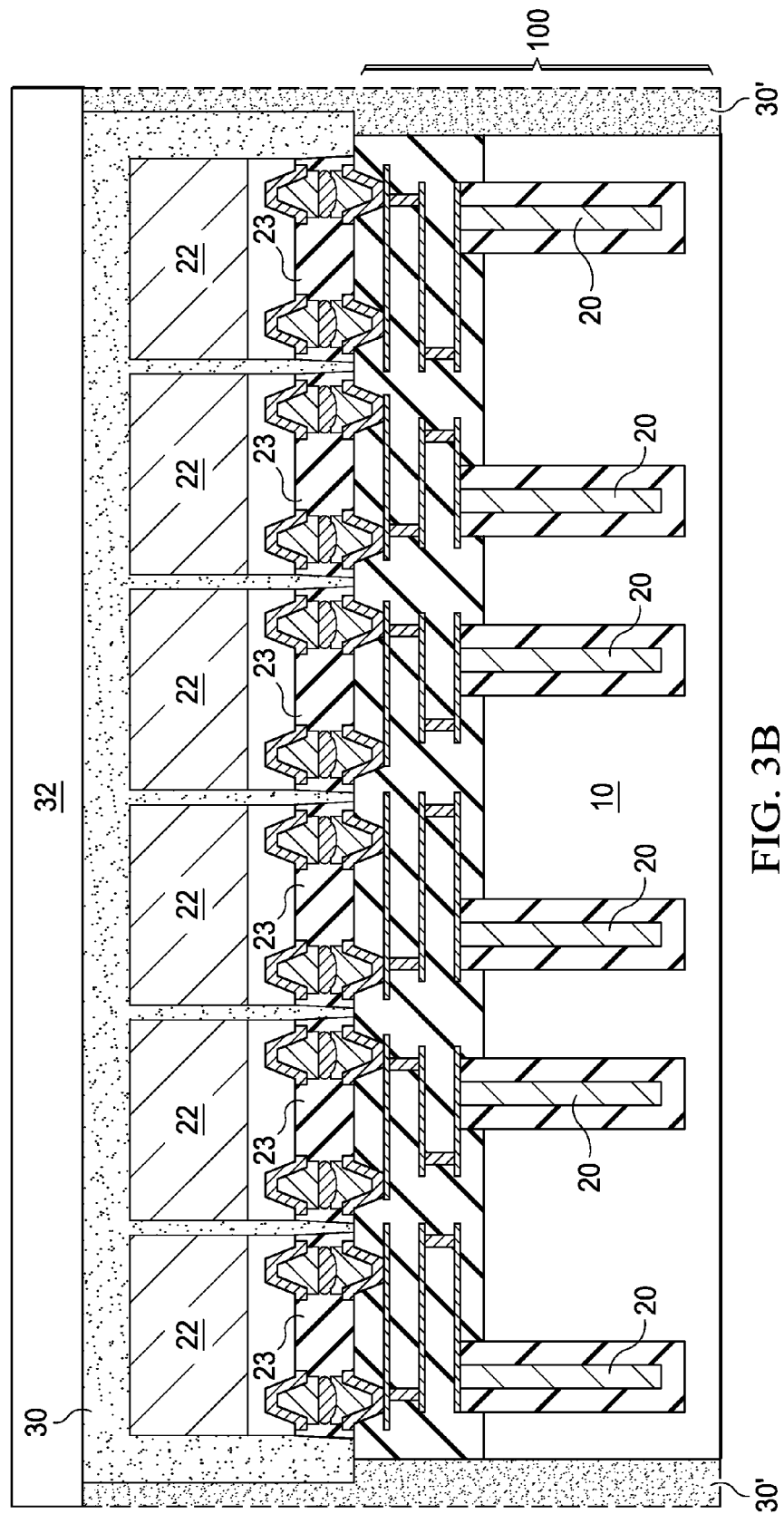
Figure 3C:
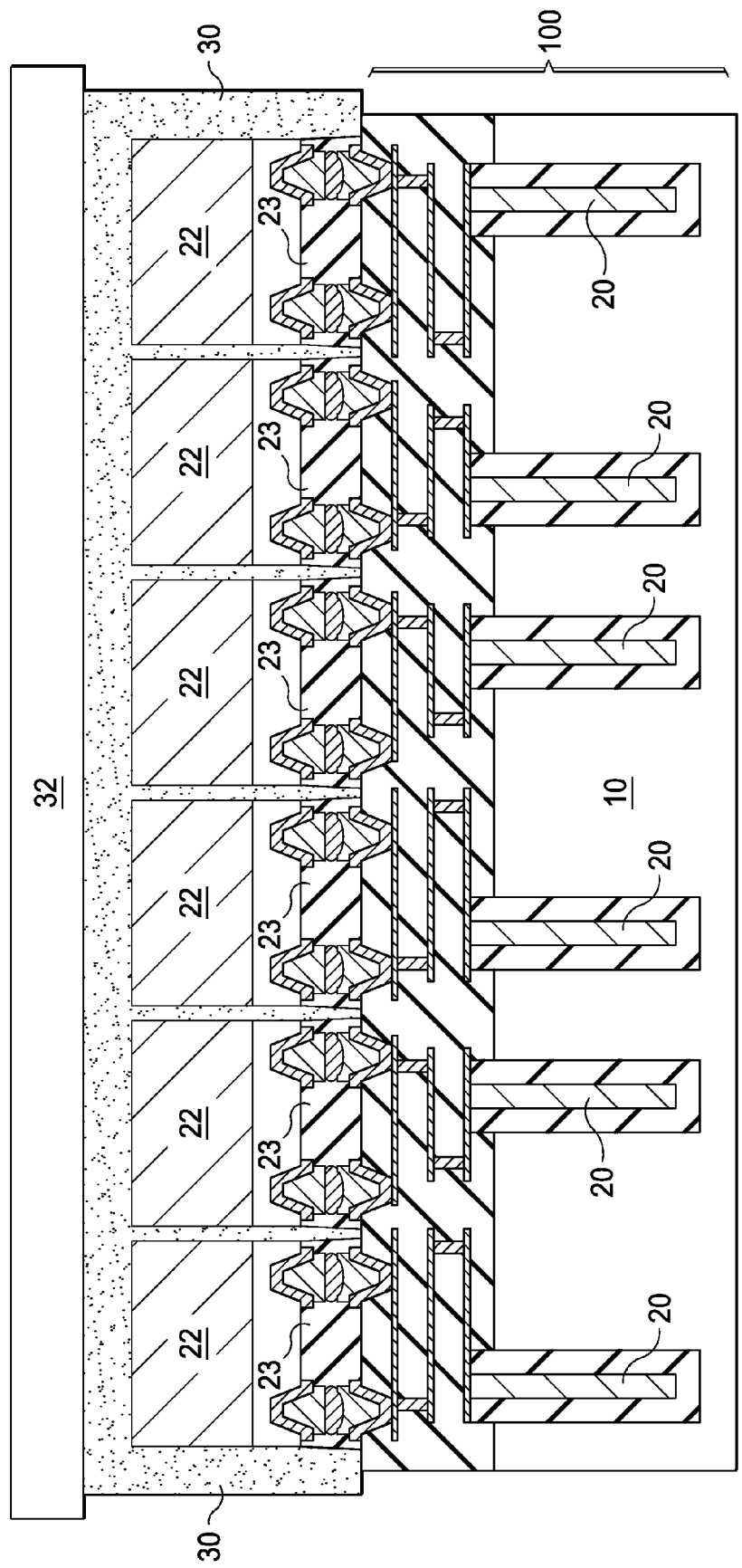

FIGS. 3A through 3C illustrate cross-sectional view of intermediate stages in the manufacturing of yet another embodiment. Unless specified otherwise, the reference numerals in these embodiments represent like elements in the embodiments illustrated in FIGS. 1A through 2C. The initial steps of this embodiment are essentially the same as shown in FIGS. 1A and 1B. Next, as shown in FIG. 3A, adhesive 30 is filled into the gaps between dies 22. The filling of adhesive 30 may be performed using a stencil printing process to ensure that the gaps between dies 22 are fully filled. An additional adhesive film may be applied on top surfaces 22a of dies 22 in an additional adhesive application step.

Next, as shown in FIG. 3B, carrier 32 is bonded onto dies 22 through adhesive 30. Next, additional adhesive 30' may be added to the edges of interposer wafer 100 to ensure the protection the edges of interposer wafer 100, as shown in FIG. 3C, in case adhesive 30 is not applied on the edges of dies 22. In subsequent process steps, which process steps are essentially similar to what are shown in FIGS. 1F through 1H, the structure as shown in FIG. 3C is flipped upside down, and a backside grinding is performed to thin substrate 10, until TSVs 20 are exposed, similar to what is shown in FIG. 1F. Backside interconnect structure 36 and metal bumps 38 are then formed, and interposer wafer 100 may be diced, similar to what is shown in FIGS. 1G and 1H.

By using the embodiments, the number of carriers needed for the packaging process is reduced to one or even zero. Accordingly, the process steps for mounting and demounting the carriers are also eliminated, resulting in a reduced manufacturing cost and a higher throughput.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   providing an interposer wafer comprising:
      a substrate; and
      a plurality of through-substrate vias (TSVs) extending from a front surface of the substrate into the substrate;
   bonding a plurality of dies onto a front surface of the interposer wafer;
   after the step of bonding the plurality of dies, filling a molding compound into gaps between the plurality of dies;
   grinding the molding compound and a top surface of the plurality of dies;

after the step of grinding on the molding compound, performing a grinding on a backside of the substrate to expose the plurality of TSVs; and forming a plurality of metal bumps on a backside of the interposer wafer and electrically coupled to the plurality of TSVs.

2. The method of claim 1, further comprising bonding a carrier over the plurality of dies before grinding the backside of the substrate.

3. The method of claim 1 further comprising:

after the step of performing the grinding on the molding compound, applying an adhesive to top surfaces of the plurality of dies; and mounting a carrier over the top surfaces of the plurality of dies through the adhesive.

4. The method of claim 1 further comprising mounting a carrier over the plurality of dies and the molding compound through a first adhesive before performing the grinding on the backside of the substrate.

5. The method of claim 1 further comprising:

after the step of bonding the plurality of dies, filling an adhesive into gaps between the plurality of dies; and mounting a carrier over top surfaces of the dies through the adhesive.

6. The method of claim 1, wherein the interposer wafer comprises no active devices therein.

7. The method of claim 6, wherein the interposer wafer comprises no transistor therein.

8. A method comprising:

providing an interposer wafer comprising:

a substrate; and a plurality of through-substrate vias (TSVs) extending from a front surface of the substrate into the substrate;

bonding a plurality of dies onto a front side of the interposer wafer;

filling a molding compound into gaps between the plurality of dies;

performing a grinding on the molding compound;

after the step of performing the grinding on the molding compound, performing a grinding on a backside of the substrate to expose the plurality of TSVs; and forming a plurality of metal bumps on a backside of the interposer wafer and electrically coupled to the plurality of TSVs.

9. The method of claim 8, wherein during the step of performing the grinding on the molding compound, top surfaces of the plurality of dies are also grinded to reduce thicknesses of the plurality of dies.

10. The method of claim 8 further comprising mounting a carrier over the plurality of dies and the molding compound through a first adhesive, before performing the grinding on the backside of the substrate.

11. The method of claim 10 further comprising, after the step of mounting the carrier and before the step of performing the grinding on the backside of the substrate, adding a second adhesive on edges of the interposer wafer.

12. The method of claim 8, wherein the interposer wafer comprises no active devices therein.

13. The method of claim 12, wherein the interposer wafer comprises no transistors therein.

* * * * *